United States Patent [19]

Singh et al.

[11] Patent Number: 5,193,103
[45] Date of Patent: Mar. 9, 1993

[54] DIGITAL PHASE LOCKED LOOP CIRCUIT

[75] Inventors: Bhajan Singh, Birmingham; Vincent Considine, Longbuckby, both of England

[73] Assignee: GEC - Marconi Limited, Stanmore-Middlesex, England

[21] Appl. No.: 729,315

[22] Filed: Jul. 15, 1991

Related U.S. Application Data

[63] Continuation-in-part of Ser. No. 317,496, Mar. 1, 1989, abandoned.

[30] Foreign Application Priority Data

Mar. 2, 1988 [GB] United Kingdom ............... 8804974

[51] Int. Cl.[5] ............................................. H04I 27/12
[52] U.S. Cl. ...................................... 375/120; 375/81; 332/127
[58] Field of Search .................. 388/805, 812–813, 388/820, 832, 911, 906; 332/107, 112, 123, 126, 127, 128; 375/62, 81, 83, 120

[56] References Cited

U.S. PATENT DOCUMENTS

| | | |
|---|---|---|
| 3,548,320 | 12/1970 | Roberts et al. |
| 3,621,403 | 3/1971 | Seiy .................................. 328/61 |
| 3,713,017 | 1/1973 | Vena . |
| 3,761,625 | 9/1973 | Bruene ............................. 178/66 A |
| 3,890,581 | 6/1975 | Stuart et al. ..................... 375/62 |
| 4,672,637 | 6/1987 | Halpern et al. .................. 375/119 |

Primary Examiner—William M. Shoop, Jr.
Assistant Examiner—David Martin
Attorney, Agent, or Firm—Jacobson, Price, Holman & Stern

[57] ABSTRACT

An all-digital phase locked loop circuit is described in which a numerically controlled oscillator is driven at a multiple of a required output frequency; a counter is provided to divide the output frequency of the oscillator by the multiple; an analogue to digital converter is provided to sample an input signal having the required frequency, and the frequency of the numerically controlled oscillator provides the sampling rate of the converter.

6 Claims, 2 Drawing Sheets

Conventional NCO Phase locked loop

Improved NCO Phase locked loop

DIGITAL PHASE LOCKED LOOP CIRCUIT

This application is a continuation in part of Ser. No. 07/317,496 of Mar. 1, 1989, now abandoned.

FIELD OF THE INVENTION

This invention relates to an all-digital phase locked loop (PLL) circuit arranged to provide, for example, a digitally represented sinewave output signal locked in phase and/or frequency to a noisy analog input signal.

BACKGROUND OF THE INVENTION

C.C.I.R. (International Radio Consultative Committee) Recommendation No. 450, Stereophonic System for VHF Frequency Modulation Broadcasting, Oslo 1946, provides for a modulated 38 KHz subcarrier to provide the stereophonic information. To this end, a pilot signal of 19 KHz (half the sub-carrier frequency) is also transmitted. The carrier frequency of the transmitter (in the range 88–108 MHz) is modulated, inter alia, by this pilot signal.

One method of regenerating the sub-carrier frequency in a stereo receiver is by means of an oscillator locked to the pilot frequency. If the regenerated sub-carrier is not adjusted to the correct phase, channel separation is lost.

The digital phase locked loop circuit shown in FIG. 1 is schematic of a known circuit for extracting the pilot tone, prior to regeneration of the sub-carrier, from a received and demodulated FM transmitted stereo signal. The received pilot tone signal is in analog form and inevitably is noisy. It is not used directly. Instead, a reproduction thereof is synthesised using an oscillator which, if digital, is followed by a sinewave generator.

In FIG. 1 of the accompanying drawings, the input signal is sampled in an Analog to Digital converter (A/D converter) 1, the converter being clocked at a sampling frequency $F_s$. A Numerically Controlled Oscillator (NCO) 4 is also clocked at the same frequency $F_s$ to provide an output which is fed to a sinewave generator 5. The output of the sinewave generator 5 provides the "extracted" pilot tone for subsequent use in a stereo receiver (not shown). A loop is provided by also feeding the output of the sinewave generator 5 to a mixer or multiplier 2 wherein it is mixed with the sampled input signal from the A/D converter 1.

An output of the mixer 2 is fed to a low pass filter 3 which passes the difference value to provide a correction signal. The correction signal is summed with a constant input value K in a summer 6 and the output of the summer 6 constitutes the input to the NCO 4, thus causing slight variations in the phase or output frequency of the NCO 4.

For accurate control of the frequency and phase of the output signal of the sinewave generator 5 (that is, the extracted pilot tone) and to ensure that it is locked to the frequency and phase of the input signal, the sinewave generator 5 must store a large number of values (usually in ROM from where they are extracted using look-up tables) to produce the requisite digitally represented sinewave output. The size of ROM and the range of addresses in a conventional sinewave generator is, in consequence, very large. Further, as the NCO 4 is clocked at the same rate, $F_s$, as the sampling rate, the sinewave generator 5 must respond very rapidly.

It is an object of the present invention to provide an all-digital phase locked loop circuit incorporating a sinewave generator wherein the required address range of the generator is much reduced.

SUMMARY OF THE INVENTION

According to the present invention, there is provided an all-digital phase locked loop circuit, comprising a numerically controlled oscillator, a sinewave generator for generating from the output of the oscillator, a sinewave of a required frequency, a counter having its input connected to an output of the oscillator and its output connected to an input to the sinewave generator, and control means for controlling the output frequency of the oscillator at a multiple of said required frequency, the counter being arranged to divide the output frequency of the oscillator by said multiple.

DETAILED DESCRIPTION OF THE INVENTION

Figure 1:
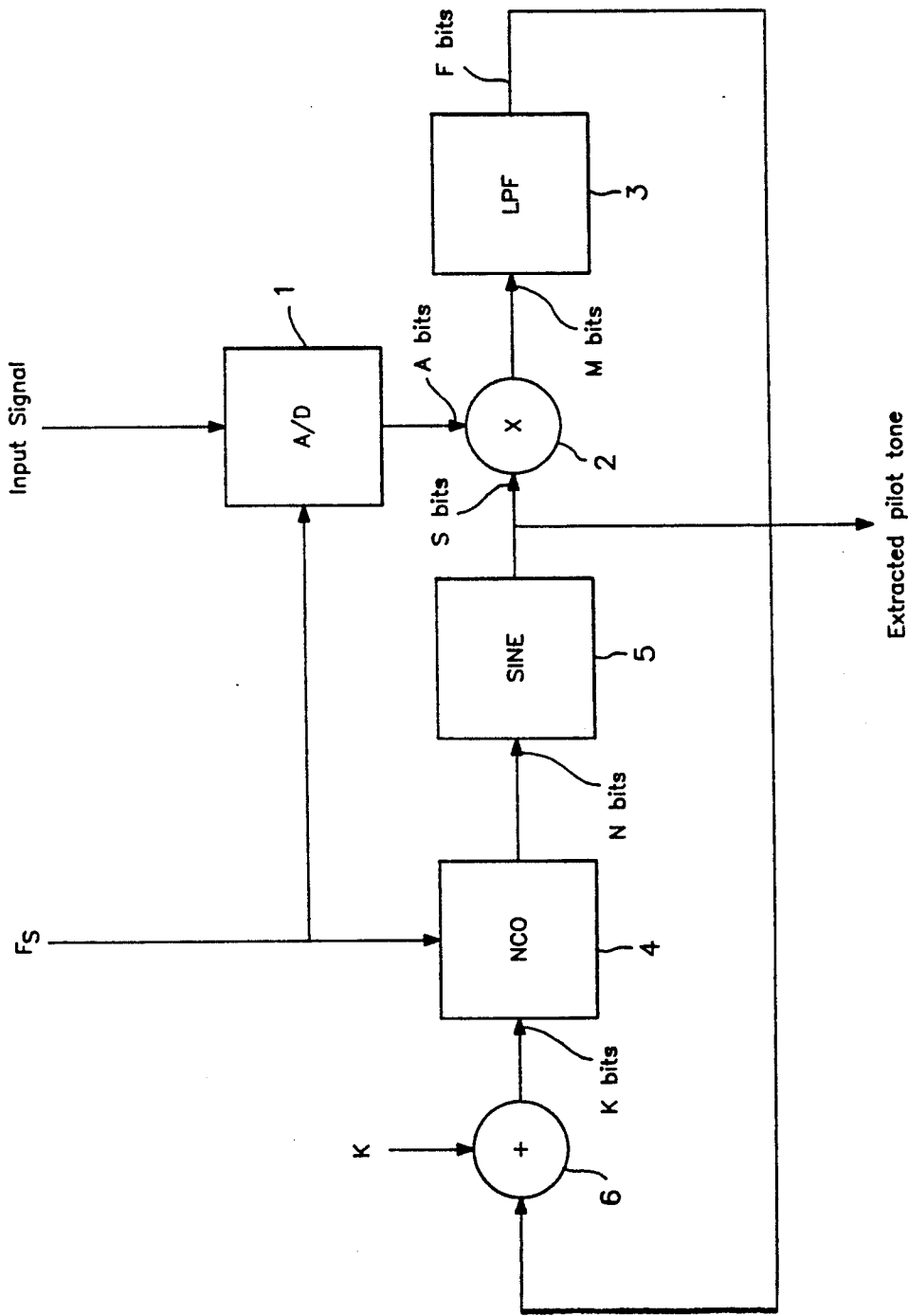
FIG. 1 is, as aforesaid, a schematic circuit diagram of a prior art all-digital phase locked loop circuit.
Figure 2:
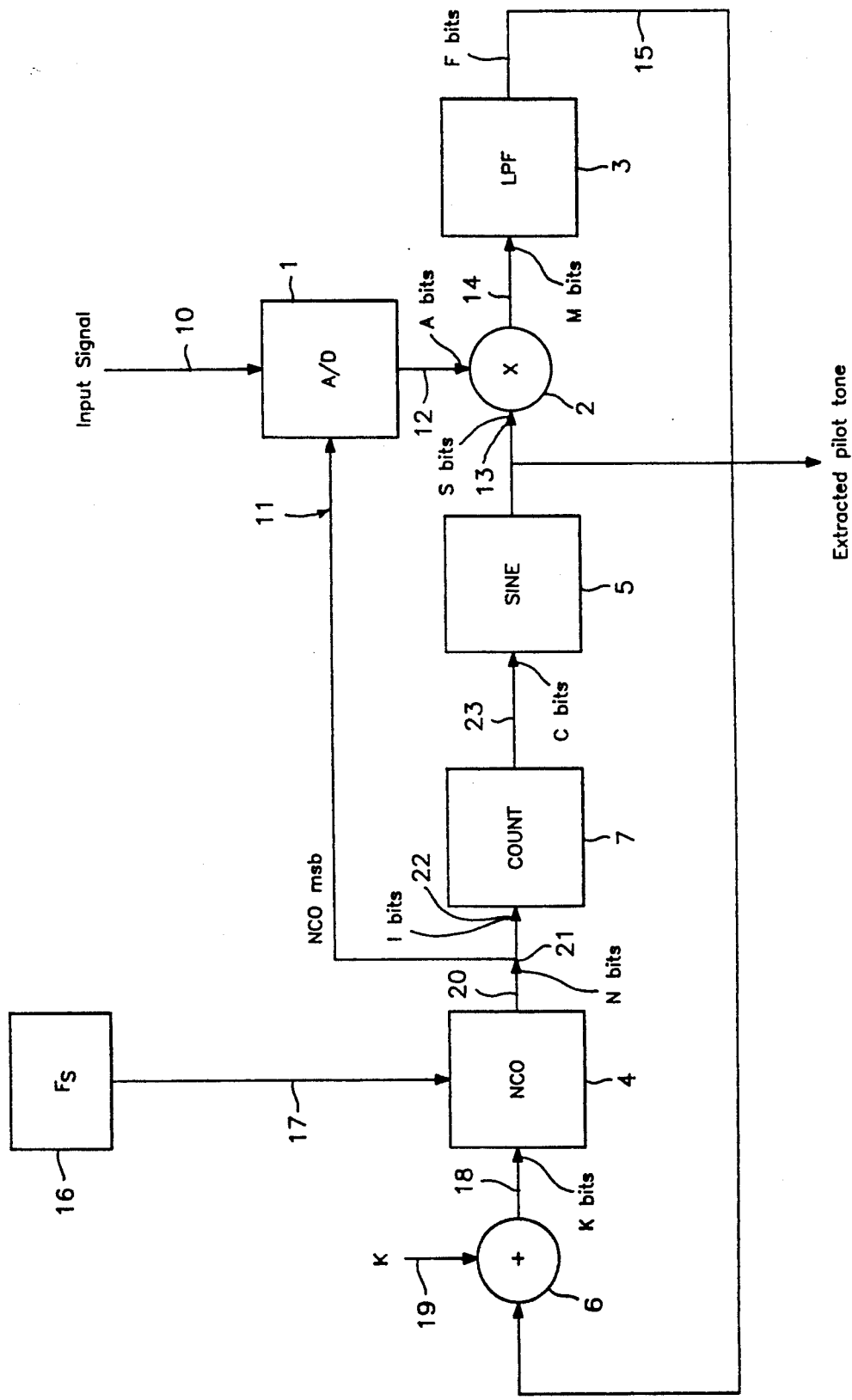
FIG. 2 of the accompanying drawings is a schematic circuit diagram of an all-digital phase locked loop circuit in accordance with the present invention.

Referring to FIG. 2 of the drawings, the all-digital phase locked loop circuit there shown is similar to that shown in FIG. 1 of the accompanying drawings. The circuit is arranged to receive a noisy analogue input signal at its input 10. The signal is fed to an analog to digital converter 1 wherein the input signal is sampled at intervals determined by a clock input 11. The sampled values of the input signal, digitally represented, are fed to an input 12 of a mixer (or multiplier) 2. A digitally represented sinewave signal of frequency that of a desired output signal of the circuit is fed to a second input 13 of the mixer 2. The mixer 2, as is well known, mixes its two input signals to provide both sum and difference output signals on an output 14. A low pass filter 3 passes only the difference output signal and this is fed out on a line 15.

A numerically controlled oscillator 4 is clocked at a first frequency $F_s$ by a clock 16 providing a clocking input 17 to the NCO 4. The NCO has an input 18 whereon it receives the output of a summer 6. The summer 6 has two inputs, on a first of which 19 is a constant value K, and a second of which inputs is constituted by the line 15 wherefrom the summer receives the difference output signal (the correction signal) of the mixer 2 via the low pass filter 3.

The NCO thus has an output frequency dependant on the sum of the constant value K and the difference or correction signal, and upon the clocking frequency of its clock input 17.

A bus 20, N bits wide, constitutes an output of the NCO 4. A tap 21 of the MSB of the output bus 20 provides a clocking signal which is fed on the line 11 to the A to D converter 1. As the MSB line of the bus 20 changes value at the output frequency of the NCO 4, the noisy analog input signal on the line 10 is sampled at the frequency of the NCO 4.

The same tap 21 feeds a signal to an input 22 of a counter 7. The counter 7 provides an output 23 at a frequency which is an integral sub-multiple of the output frequency of the NCO 4. The output 23 constitutes an input to a sinewave generator 5 and an output of the sinewave generator 5 constitutes the second input 13 of the mixer 2.

The output of the sinewave generator 5 also constitutes the output signal of the phase locked loop circuit. In the prior art referred to at the beginning of this specification it was stated that stereo broadcasts contain a pilot signal indicative, firstly, of a stereo transmission and the frequency and phase of which pilot signal is used to provide stereo separation of the two channels. Thus, if it is required to extract from a noisy analog input signal, the pilot tone, the circuit just described acts as a signal generator of the pilot tone but the so-generated pilot tone signal must be locked in phase and frequency with that transmitted and forming part of the noisy analog input signal.

In this particular case, the pilot tone of a stereo transmission has a frequency of 19 KHz. Thus, the signal generated by the sinewave generator 5 should have a frequency of 19 KHz. As stated above, the input 23 to the sinewave generator 5, the output of the counter 7, is an integral sub-multiple of the NCO output frequency. If the counter 7 is a divide by seven counter, the NCO output frequency will be 133 KHz ($7 \times 19$ KHz).

This can be achieved, as stated above, in dependance upon the input constant K, the clocking frequency $F_s$ and the bit width of the output bus 20 of the NCO 4.

For example, the clocking frequency $F_s$ of the NCO 4 may be 2.8 MHz. If the NCO 4 had a maximum count of 400 (binary 110010000) then an input K of 19 (binary 10011) would cause the oscillator output frequency to be 133 KHz as desired. The MSB of NCO 4 output 20 would change value at a frequency of 133 KHZ.

In the prior art arrangement shown in FIG. 1, the NCO clocking frequency was frequently of this value of 2.8 MHz. A similar clocking frequency of 2.8 MHz was applied to the A/D converter to sample the incoming noisy analog input signal at such a frequency. If the value K in the prior art was 19, as above suggested, the sinewave generator would have to include 400 addresses in ROM and a consequent 400 values output as digital representations of a sinewave. Besides holding a large ROM, the sinewave generator (and the A/D converter) of the prior art would operate at 2.8 MHz.

In accordance with the present invention, the provision of the counter 7 clocked by the MSB of the NCO 4 enables a sinewave generator 5 to be provided which needs to hold only seven addresses in ROM and which operates at the reduced frequency of 133 KHz. Further, utilising the MSB of the NCO 4 to clock the A/D converter 1 requires the converter 1 to operate at the reduced frequency of 133 KHz.

Control of the NCO's output frequency is achieved in the same way as in the prior art. The mixer 2 which receives the sampled input signal from the converter 1 and the output signal from the sinewave generator 5, provides an output including a difference signal (if any), which is passed by the filter 3 and provides an instantaneous correction to the input to the NCO 4, when summed with the constant input K.

The advantage provided by the circuit of the present invention is readily appreciated. In lock, the input signal and output signal frequencies and phases are the same. As the input signal is sampled at a rate determined by the output frequency of the NCO 4, only a very limited range of values are necessarily provided in the look-up table of the sinewave generator 5. The size of its accompanying ROM can therefore be reduced. In practice, the number of samples required is equal to the ratio of the A/D sampling frequency to the required pilot tone frequency, that is the division ratio of the counter 7. For example, in one realisation, seven eight-bit samples may be required where the output frequency of the NCO 4 is seven times greater than the frequency of the required pilot tone and the counter 7 divides by seven.

The actual samples stored are user defined and hence it is possible to program the phase angle to which the loop locks by simply changing the phase of the samples stored. The stored samples may be provided in ROM, RAM, gates or a PLA and, as desired, the samples may be predetermined or software generated. Similarly, the constant K, and the divisor of the counter 7 may be software controlled.

We claim:

1. An all-digital phase locked loop circuit for providing from a noisy analog input containing a desired signal, a digital output signal matching in frequency and phase the desired signal, the circuit comprising:
   an analog to digital converter whereto the noisy analog input is fed;
   clocking means for clocking said converter to provide digital samples of the noisy analog input;
   a numerically controlled oscillator, said oscillator having an output of frequency a predetermined multiple of a frequency of the desired signal;
   a counter, said counter receiving, as an input thereto, the output of said oscillator, said counter serving to divide the output of said oscillator by the predetermined multiple, to provide a counter output;
   a sinewave generator, said generator receiving as an input thereto, the counter output and providing, as an output of the generator, sinusoidally varying digital values representing the desired signal;
   a mixer, said mixer receiving, as inputs, the digital samples and the generator output, said mixer having an output including a difference value between the inputs, the difference value being fed to said oscillator to control the frequency of the output thereof.

2. An all-digital phase locked loop circuit according to claim 1 including a clock for clocking said oscillator at a first frequency, said oscillator having an output bus, an MSB line of said output bus changing value at the frequency of the oscillator, said MSB line constituting said clocking means for clocking said analog to digital converter.

3. An all-digital phase locked loop circuit according to claim 2 wherein said MSB line constitutes also the output of said oscillator which is fed as the input to said counter.

4. An all-digital phase locked loop circuit according to claim 1 wherein a low pass filter is arranged to receive the output of said mixer so as to pass only the difference value to said oscillator.

5. An all-digital phase locked loop circuit according to claim 1 further including a summer, said summer being arranged to receive, as inputs thereto, the difference value and a constant value and to sum the same, said summer having an output constituting an input to said oscillator.

6. An all-digital phase locked loop circuit according to claim 1 wherein said sinewave generator includes a look-up table in which are stored digital representations of sinewave values corresponding to the counter output, the digital representations and hence the sinewave values being user definable.

* * * * *